United States Patent
Ishizuka et al.

(10) Patent No.: US 7,060,614 B2
(45) Date of Patent: Jun. 13, 2006

(54) METHOD FOR FORMING FILM

(75) Inventors: Hotaka Ishizuka, Nirasaki (JP); Tsukasa Matsuda, Nirasaki (JP)

(73) Assignee: Tokyo Electron Limited, Tokyo-to (JP)

( * ) Notice: Subject to any disclaimer, the term of this patent is extended or adjusted under 35 U.S.C. 154(b) by 37 days.

(21) Appl. No.: 10/333,963

(22) PCT Filed: Jul. 25, 2001

(86) PCT No.: PCT/JP01/06413

§ 371 (c)(1),
(2), (4) Date: Jan. 27, 2003

(87) PCT Pub. No.: WO02/10472

PCT Pub. Date: Feb. 7, 2002

(65) Prior Publication Data

US 2003/0170981 A1  Sep. 11, 2003

(30) Foreign Application Priority Data

Jul. 28, 2000  (JP) .............................. 2000-229715

(51) Int. Cl.
*H01L 21/44* (2006.01)
(52) U.S. Cl. ...................... 438/677; 438/648; 438/680; 438/685
(58) Field of Classification Search ............... 438/677, 438/680, FOR. 405, 648, 685
See application file for complete search history.

(56) References Cited

U.S. PATENT DOCUMENTS

| 5,231,056 | A | * | 7/1993 | Sandhu ........................ 438/654 |
| 5,272,112 | A | | 12/1993 | Schitz et al. ................. 437/192 |
| 5,342,652 | A | | 8/1994 | Foster et al. ................. 427/253 |
| 5,407,698 | A | * | 4/1995 | Emesh ......................... 427/99 |
| 5,429,991 | A | * | 7/1995 | Iwasaki et al. .............. 438/653 |
| 5,489,552 | A | | 2/1996 | Merchant et al. ........... 437/192 |
| 5,510,146 | A | * | 4/1996 | Miyasaka .................... 438/151 |
| 5,686,355 | A | | 11/1997 | Sumi et al. .................. 437/192 |
| 5,795,824 | A | | 8/1998 | Hancock ...................... 438/656 |

(Continued)

FOREIGN PATENT DOCUMENTS

EP  0481706 A1 *  4/1992

(Continued)

*Primary Examiner*—Michelle Estrada
(74) *Attorney, Agent, or Firm*—Smith Gambrell & Russell LLP (57) ABSTRACT

In a deposition method according to the present invention, a substrate (10) is first arranged in a processing vessel to carry out a heat-up step. Then, Si-containing gas, such as $SiH_4$ gas, is supplied into the processing vessel to carry out an initiation step serving as a pretreating step on the substrate (ST2). Then, a deposition gas is supplied into the processing vessel to carry out a deposition step (ST3). By carrying out the initiation step (ST2) by setting the partial pressure of the Si-containing gas to be not less than 50 Pa (not less than 100 Pa when the heat-up step is not carried out), it is possible to stably produce a film having a good surface condition.

15 Claims, 8 Drawing Sheets

U.S. PATENT DOCUMENTS

| | | | |
|---|---|---|---|
| 5,801,634 A | | 9/1998 | Young et al. ............... 340/635 |
| 5,834,371 A | * | 11/1998 | Ameen et al. ............... 438/656 |
| 6,022,798 A | | 2/2000 | Sumi et al. ................. 438/637 |
| 6,066,366 A | | 5/2000 | Berenbaum et al. ........ 427/250 |
| 6,143,128 A | * | 11/2000 | Ameen et al. ......... 156/345.24 |
| 6,174,795 B1 | * | 1/2001 | Shih et al. .................. 438/597 |
| 6,177,149 B1 | * | 1/2001 | Tada et al. .................. 427/576 |
| 6,211,042 B1 | * | 4/2001 | McFeely et al. ............ 438/478 |
| 6,303,480 B1 | * | 10/2001 | Desai et al. ................ 438/584 |
| 6,358,844 B1 | * | 3/2002 | Wang et al. ................ 438/654 |
| 2002/0005159 A1 | * | 1/2002 | Kitagawa et al. ............. 117/13 |

FOREIGN PATENT DOCUMENTS

| | | | |
|---|---|---|---|
| JP | 07-172809 | 7/1995 | ..................... 33/6 |
| JP | 7-273046 | 10/1995 | |
| JP | 8-17760 | 1/1996 | |
| JP | 8-124876 | 5/1996 | |
| JP | 09-298169 | 11/1997 | ..................... 21/28 |
| JP | 10-32248 | 2/1998 | |
| JP | 10-212583 | 8/1998 | ..................... 16/44 |

* cited by examiner

METHOD FOR FORMING FILM

TECHNICAL FIELD

The present invention relates to a deposition method for forming a thin film of W (tungsten) or the like on a substrate, such as a semiconductor wafer, in a processing vessel.

BACKGROUND ART

In semiconductor producing processes, in order to form a wiring pattern on a semiconductor wafer as a substrate (which will be hereinafter referred to as a "wafer") or in order to fill in a hole between wiring portions, a metal or metal compound, such as W, WSi (tungsten silicide), Ti (titanium), TiN (titanium nitride) or TiSi (titanium silicide), is deposited to form a thin film.

When a W thin film is deposited, $SiH_4$ (silane) gas is fed to carry out a pretreating called initiation prior to the deposition. It is an object of the initiation to absorb $SiH_x$ (e.g. x=1 to 3) on a wafer prior to the formation of the W film so as to form a uniform W film without abnormal grain growth thereon.

However, there are conventional problems in that, when such an initiation process is carried out, abnormal grain growth is caused during the deposition of the W film, or the surface condition of the W film is deteriorated, due to the influence of the type of the under layer or the surface condition or due to the influence of conditions in the processing vessel. Such problems are remarkable particularly when a low temperature process on a wiring pattern, such as a bit line, is carried out or when a thin film having a thickness of about 100 nm is formed.

In order to eliminate such abnormal grain growth and/or deterioration of the surface condition, a nucleation process is carried out at the beginning of the deposition of the W film. However, in this case, the margin of process conditions is very small, so that it is difficult to stably produce a film having a good surface condition.

DISCLOSURE OF THE INVENTION

The present invention has been made in view of the above described circumstances, and it is an object of the present invention to provide a deposition method capable of stably forming a film having a good surface condition on a substrate.

The inventors have diligently studied a pretreating prior to the deposition in order to enable to stably form a film having a good surface condition on a substrate. As a result, the inventors have found that it is effective to increase a partial pressure of an Si-containing gas, e.g. $SiH_4$ gas, when the pretreating is carried out.

That is, if the partial pressure of the Si-containing gas is increased in the pretreating, molecules of the Si-containing gas are activated so that the probability of those molecules contacting the surface of the substrate is increased. As a result, Si-containing molecules, e.g. $SiH_x$ molecules, are uniformly absorbed onto the substrate. Therefore, in the subsequent deposition, the film is uniformly grown on the substrate so that the surface condition of the film is good, and it is difficult for the abnormal grain growth to be caused.

Therefore, according to the present invention, a film having a good surface condition can be stably formed on the substrate by increasing the partial pressure of an Si-containing gas, e.g. an $SiH_4$ gas. Conventionally, since initiation is carried out at a flow rate of the $SiH_4$ gas of 0.4×10$^{-2}$ to 2×10$^{-2}$ L/min under a total pressure of 533 to 2667 Pa, the pressure of $SiH_4$ is low, so that the surface condition of the deposited W film is bad. On the other hand, if the partial pressure of the Si-containing gas, e.g. $SiH_4$ gas, is increased according to the present invention, such problems are eliminated.

Thus, according to the present invention, there is provided a deposition method for forming a film on a substrate, said method comprising: a step of arranging a substrate in a processing vessel; a pretreating step of supplying an Si-containing gas into said processing vessel to pretreat said substrate; and a deposition step of supplying a deposition gas into said processing vessel to form a film on the pretreated substrate, said pretreating step being carried out at a partial pressure of said Si-containing gas of not less than 100 Pa.

According to the present invention, there is also provided a deposition method for forming a film on a substrate, said method comprising: a step of arranging a substrate in a processing vessel; a pretreating step of supplying an Si-containing gas into said processing vessel to pretreat said substrate; a preheating step of preheating the pretreated substrate in said processing vessel; and a deposition step of supplying a deposition gas into said processing vessel to form a film on the preheated substrate, said pretreating step being carried out at a partial pressure of said Si-containing gas of not less than 50 Pa.

That is, if a preheating step of preheating the substrate prior to the pretreating step is carried out, the surface condition of the film can be good even if the partial pressure of the Si-containing gas is lower.

More specifically, according to the present invention, there is provided a deposition method for forming a film on a substrate, said method comprising: a step of arranging a substrate in a processing vessel; a pretreating step of supplying an $SiH_4$ gas into said processing vessel to pretreat said substrate; and a deposition step of supplying a deposition gas into said processing vessel to form a W thin film on the pretreated substrate, said pretreating step being carried out at a partial pressure of said $SiH_4$ gas of not less than 100 Pa.

According to the present invention, there is also provided a deposition method for forming a film on a substrate, said method comprising: a step of arranging a substrate in a processing vessel; a pretreating step of supplying an $SiH_4$ gas into said processing vessel to pretreat said substrate; a preheating step of preheating the pretreated substrate in said processing vessel; and a deposition step of supplying a deposition gas into said processing vessel to form a W thin film on the preheated substrate, said pretreating step being carried out at a partial pressure of said $SiH_4$ gas of not less than 50 Pa.

BEST MODE FOR CARRYING OUT THE INVENTION

Referring to the accompanying drawings, the preferred embodiment of the present invention will be described below.

Figure 1:
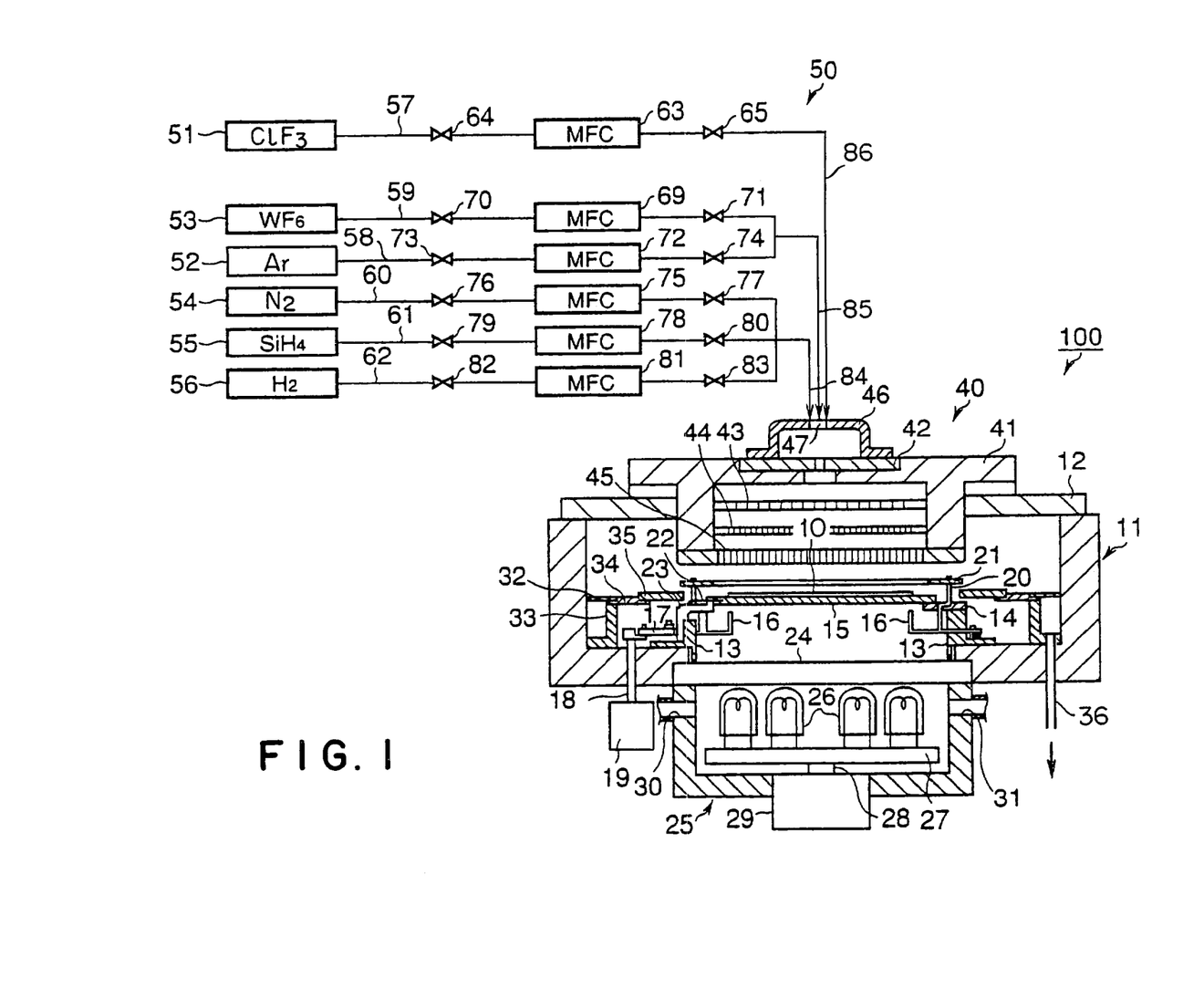
FIG. 1 is a sectional view showing an example of a CVD system used for carrying out a deposition method according to the present invention.

FIG. 1 schematically shows a CVD system for depositing a W film on a wafer 10 serving as a substrate, as an example of a CVD system used for carrying out the deposition method of the present invention.

The CVD system 100 shown in FIG. 1 has a cylindrical processing vessel 11 of, e.g. aluminum, and a lid 12 provided thereon. In the processing vessel 11, a pedestal (supporting table) 15 for supporting thereon the wafer 10 is provided, via a holding member 14, on a supporting member 13 rising from the bottom of the vessel. The radial inner surface of the supporting member 13 is formed so as to reflect heat rays. The pedestal 15 is formed of a carbon or ceramic material having a thickness of about 2 mm.

Below the pedestal 15, e.g. three lift pins 16 for lifting the wafer 10 from the pedestal 15 are provided. These lift pins 16 are supported on a push-up rod 18 via a holding member 17. The push-up rod 18 is connected to an actuator 19. Thus, if the actuator 19 moves the push-up rod 18 in vertical directions, the lift pins 16 moves by means of the push-up rod 18 and holding member 17 in vertical directions to move the wafer 10 in vertical directions.

The lift pins 16 are formed of a heat ray permeable material, e.g. quartz. The lift pins 16 are integrally formed with a supporting member 20. On the supporting member 20, a shield ring 21 is mounted. The shield ring 21 has the function of preventing heat rays of a halogen lamp 26, which will be described later, from radiating upwards and of ensuring a passage for a cleaning gas during a cleaning process. In the pedestal 15, a thermocouple 22 for measuring the heating temperature of the wafer 10 is buried. A holding member 23 for holding the thermocouple 22 is mounted on the supporting member 13.

On the bottom of the processing vessel directly below the pedestal 15, a transmission window 24 of a heat ray permeable material, such as quartz, is airtightly mounted. Below the transmission window 24, a box-shaped heating chamber 25 is provided so as to surround the transmission window 24. In the heating chamber 25, e.g. four halogen lamps 26 are mounted on a rotating table 27 also serving as a reflector. The rotating table 27 is designed to be rotated, via a rotating shaft 28, by a rotating motor 29 provided in the bottom of the heating chamber 25. Therefore, heat rays emitted from the halogen lamps 26 can pass through the transmission window 24 to be irradiated on the bottom face of the pedestal 15 to heat it. In the side wall of the heating chamber 25, a cooling air inlet 30 for feeding cooling air for cooling the interior thereof and transmission window 24, and a cooling air outlet 31 for discharging the air are provided.

Around the periphery of the pedestal 15, a ring-shaped straightening vane 32 having a large number of straightening holes is provided. The straightening vane 32 is mounted on a water cooling plate 34 provided on an annular supporting column 33. On the radial inner side of the cooling plate 34, a ring-shaped attachment 35 of quartz or aluminum is provided for preventing the upper processing gas from flowing downwards. Below the straightening plate 32, the cooling plate 34 and the attachment 35, an inert gas, such as $N_2$ and/or Ar gas, which does not react with the processing gas during deposition, is supplied as a backside gas. This prevents the processing gas from entering below the pedestal 15 to cause excessive deposition functions.

On the bottom of the processing vessel 11, an outlet 36 is provided. To the outlet 36, a vacuum pump (not shown) is connected. Thus, the interior of the processing vessel 11 can be maintained in a predetermined vacuum state.

In the ceiling of the processing vessel 11, a shower head 40 for feeding the processing gas or the like is provided. The shower head 40 has a shower base 41 fitted into the lid 12. At the center of the top of the shower base 41, an orifice plate 42 for passing the processing gas or the like is provided. Below the orifice plate 42, upper and lower diffusion plates 43 and 44 are provided. Below the diffusion plates 43 and 44, a shower plate 45 is provided. Above the orifice plate 42, a gas receiving member 46 having a gas inlet 47 is arranged. To the gas inlet 47, a gas supply mechanism 50 for supplying the process gas or the like into the processing vessel 11 is connected.

The gas supply mechanism 50 has a $ClF_3$ gas supply source 51, an Ar gas supply source 52, a $WF_6$ gas supply source 53, an $N_2$ gas supply source 54, an $SiH_4$ gas supply source 55 and an $H_2$ gas supply source 56. To the $ClF_3$ gas supply source 51, a gas line 57 is connected. In the gas line 57, a mass flow controller 63 and shut-off valves 64 and 65 upstream and downstream thereof are provided. To the Ar gas supply source 52, a gas line 58 is connected. In the gas line 58, a mass flow controller 72 and shut-off valves 73 and 74 upstream and downstream thereof are provided. To the $WF_6$ gas supply source 53, a gas line 59 is connected. In the gas line 59, a mass flow controller 69 and shut-off valves 70 and 71 upstream and downstream thereof are provided.

To the $N_2$ gas supply source 54, a gas line 60 is connected. In the gas line 60, a mass flow controller 75 and shut-off valves 76 and 77 upstream and downstream thereof are provided. To the $SiH_4$ gas supply source 55, a gas line 61 is connected. In the gas line 61, a mass flow controller 78 and shut-off valves 79 and 80 upstream and downstream thereof are provided. To the $H_2$ gas supply source 56, a gas line 62 is connected. In the gas line 62, a mass flow controller 81 and shut-off valves 82 and 83 upstream and downstream thereof are provided.

Of the above described gas lines 57 to 62, the gas line 57 is connected to the gas inlet 47 via a gas line 86. The gas lines 58 and 59 are connected to the gas inlet 47 via a common gas line 85. The gas lines 60, 61 and 62 are connected to the gas inlet 47 via a common gas line 84.

A preferred embodiment of a deposition method according to the present invention using the CVD system 100 with the above construction will be described below. An example of a typical method for forming a W thin film on a wafer 10 provided with a TiN thin film (an underlying film) as a barrier layer previously formed thereon will be described below.

First, a gate valve (not shown) provided in the side wall of the processing vessel 11 is open to carry a wafer 10 in the processing vessel 11. Specifically, after the wafer 10 is delivered above the raised lift pins 16, the push-up rod 18 is moved downwards to depress the lift pins 16 to put the wafer 10 on the pedestal 15.

Figure 2:
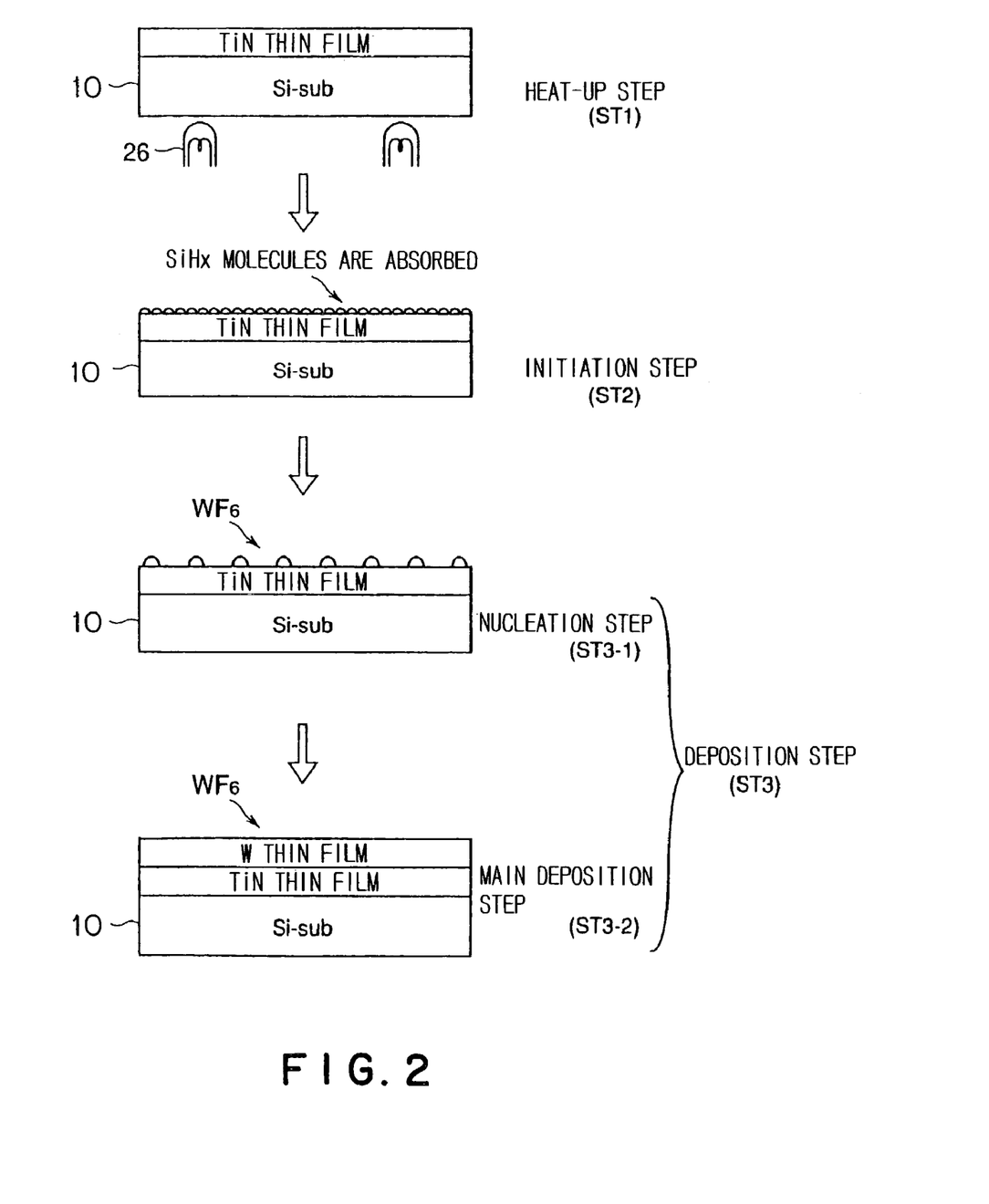
FIG. 2 is a schematic view sequentially showing steps of a preferred embodiment of a deposition method according to the present invention.

Then, while the processing vessel 11 is evacuated from the outlet 36, predetermined gases are supplied into the processing vessel 11 from the gas supply mechanism 50 via the shower head 40. In this state, a heat-up (preheating) step (ST1), an initiation step (ST2) and a deposition step (ST3) are sequentially carried out as shown in FIG. 2. The deposition step is carried out. Specifically, the deposition step (ST3) includes a nucleation step (ST3-1) and a subsequent main deposition step (ST3-2).

At the heat-up step, while predetermined gases, e.g. Ar gas, $H_2$ gas and $N_2$ gas, are flown at predetermined flow rates into the processing vessel 11, the wafer 10 is heated at a predetermined temperature, and this state is held for a predetermined period of time. The heating is carried out by heat rays of the halogen lamps 26 in the heating chamber 25 by turning the lamps 26 on. The heating temperature is preferably in the range of from 380° C. to 500° C. being a deposition temperature, and the predetermined period of holding time is preferably in the range of from 10 seconds to 120 seconds. By this heat-up step (ST1), it is possible to inhibit abnormal grain growth from being caused in a W thin film subsequently being deposited.

Figure 3:
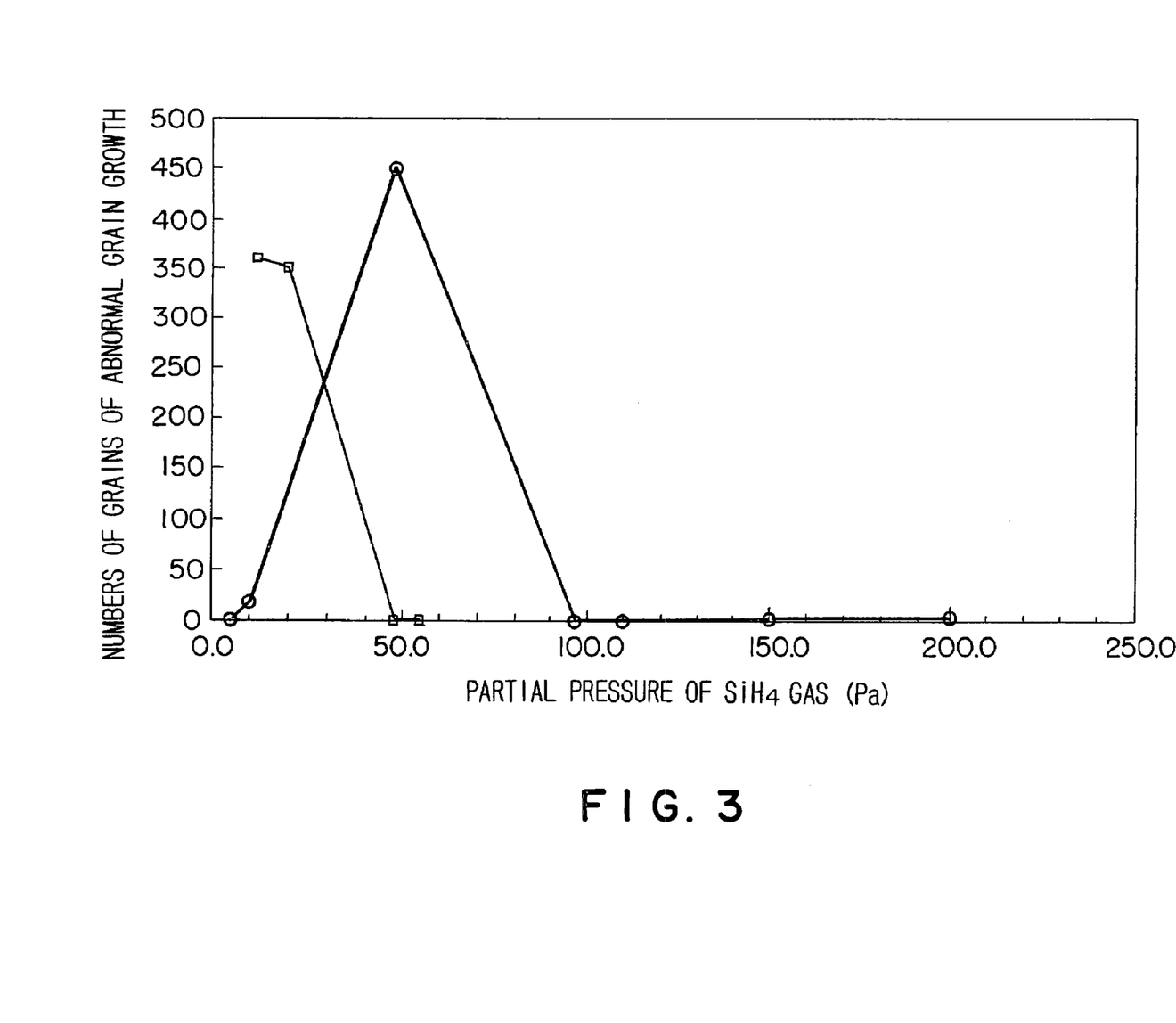
FIG. 3 is a graph showing the relationship between the partial pressure of $SiH_4$ gas at an initiation step and the number of grains of abnormal grain growths formed at the subsequent deposition step, in accordance with the presence of a heat-up step.

FIG. 3 shows the relationship between the partial pressure of $SiH_4$ at the initiation step and the number of grains of abnormal grain growth (grains having a size of not less than 0.2 im) in the W thin film formed at the subsequent deposition step. From this figure, it can be seen that, when the partial pressure of $SiH_4$ gas is about not less than 50 Pa, if the heat-up step is carried out prior to the initiation step, abnormal grain growth can be more effectively inhibited (see narrower line graph with square marks in FIG. 3). On conditions in FIG. 3, the heat-up step was carried out at a heating temperature of 410° C. for 80 seconds under a total pressure of 10666 Pa by feeding Ar gas, $H_2$ gas and $N_2$ gas into the processing vessel. On these conditions, abnormal grain growth does not appear at a partial pressure of $SiH_4$ gas of about not less than 100 Pa even if the heat-up step is not carried out (see bolder line graph with circle marks in FIG. 3). However, if the heat-up step is not carried out, there are conditions on which abnormal grain growth exists even in a region wherein the partial pressure of $SiH_4$ gas at the initiation step is relatively high. In that case, the heat-up step is effective. However, if abnormal grain growth is sufficiently inhibited at the next initiation step (ST2), it is not always required to carry out the heat-up step.

At the initiation step (ST2), while the heating halogen lamps 26 are turned on, $SiH_4$ gas is supplied into the processing vessel 11 to carry out a pretreating prior to deposition. At this initiation step, the partial pressure of $SiH_4$ gas in the processing vessel 11 is set to be not less than 100 Pa. As a result, $SiH_x$ (e.g. x=1 to 3) can be uniformly absorbed onto the wafer 10 (onto the TiN film in fact). Thus, the surface condition of a W thin film formed at the subsequent deposition step (ST3) can be good and the abnormal grain growth can be decreased.

Figure 4:
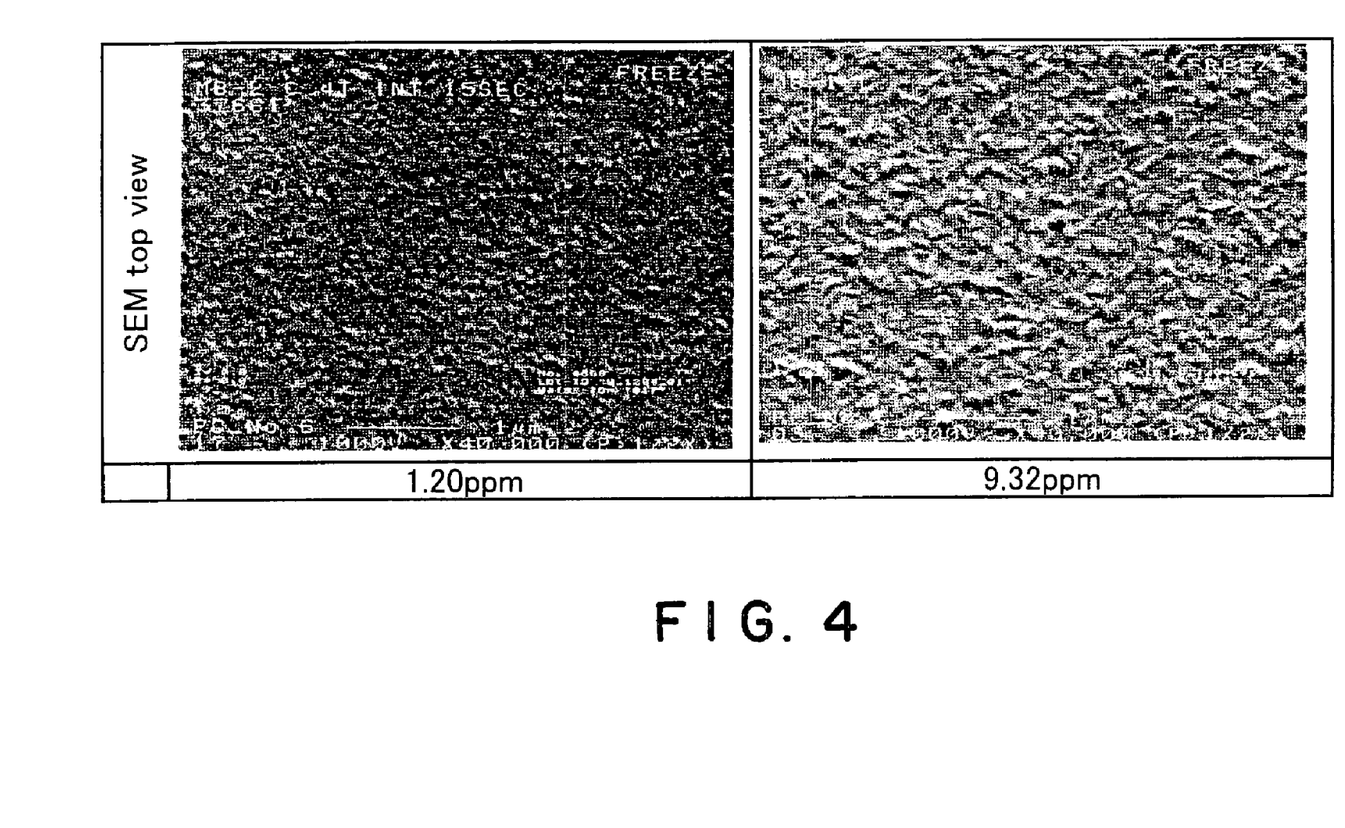
FIG. 4 shows SEM photographs showing the surface conditions of a deposited W thin film when the value of Haze is 1.20 ppm and 9.32 ppm.

As an index of the surface condition of the W thin film, the value of Haze can be used. The value of Haze expresses the surface roughness of the W thin film by ppm (parts per million). As this value is smaller, a better surface condition having higher smoothness is obtained. FIG. 4 shows SEM photographs showing the surface conditions of the W thin film when the value of Haze is 1.20 ppm and 9.32 ppm, respectively. It can be seen from this figure that the surface condition is smoother when the value of Haze is 1.20 ppm.

Figure 5:
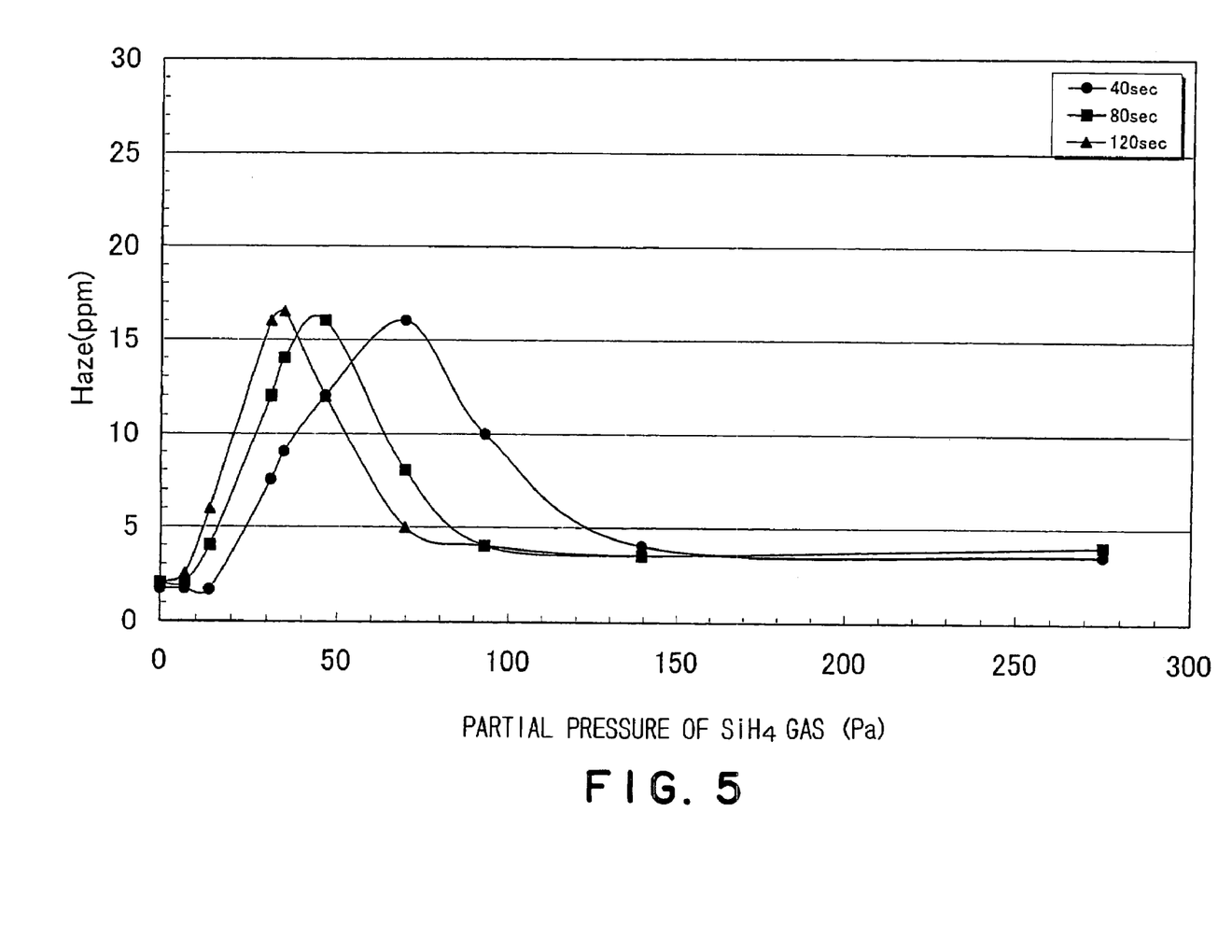
FIG. 5 is a graph showing the relationship between the partial pressure of $SiH_4$ at an initiation step and the value of Haze of a W thin film formed at the subsequent deposition step.

FIG. 5 is a graph showing the relationship between the partial pressure of $SiH_4$ gas at the initiation step on the axis of abscissas and the value of Haze of the deposited W thin film on the axis of ordinates. In this case, the initiation step was carried out at a flow rate of $SiH_4$ gas of 0 to $9.0 \times 10^{-2}$ L/min at a heating temperature of 410° C. under a total pressure of 533 to 10666 Pa in the processing vessel. The processing time was set to be 40 seconds, 80 seconds and 120 seconds. As a gas other than $SiH_4$ gas, $H_2$ gas was used. At the deposition step, the nucleation step was first carried out at a heating temperature 410° C. for 30 seconds while feeding $WF_6$ gas at a flow rate of $1.5 \times 10^{-2}$ L/min, and then, the flow rate of $WF_6$ was increased to $7.0 \times 10^{-2}$ L/min to carry out the main deposition for 27 seconds to form a W film having a thickness of 100 nm.

As can be clearly seen from FIG. 5, the value of Haze is a good value of not more than 9 ppm if the partial pressure of $SiH_4$ gas is set to be not less than 100 Pa (when the processing time is 40 seconds). The surface condition of the W thin film is preferred if the value of Haze is not more than 5 ppm. As can be seen from FIG. 5, if the processing time is 40 seconds, the value of Haze is not more than 5 ppm when the partial pressure of $SiH_4$ gas is not less than 120 Pa. Accordingly, the partial pressure of $SiH_4$ is preferably not less than 120 Pa. If the partial pressure of $SiH_4$ is less than 50 Pa, the value of Haze is also good. However, in this range, the abnormal grain growth is large. The heating temperature is preferably in the range of from 380° C. to 500° C.

Figure 6:
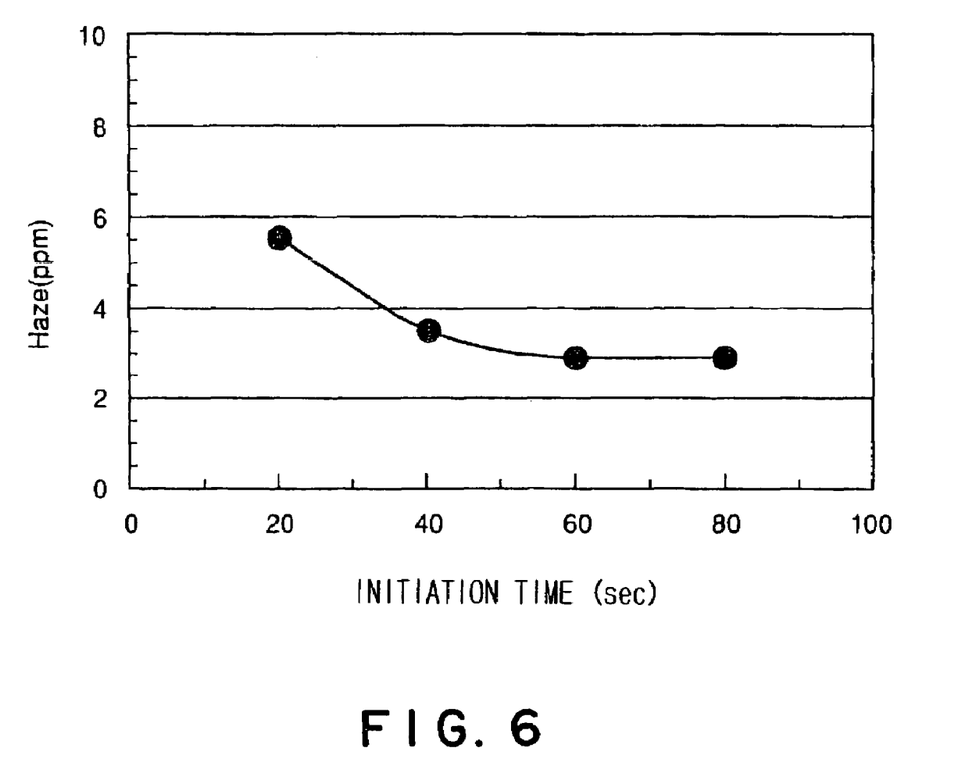
FIG. 6 is a graph showing the relationship between the initiation time and the value of Haze of a W thin film.

The initiation step is preferably carried out for not less than 40 seconds. FIG. 6 is a graph showing the relationship between the time to carry out the initiation step and the value of Haze of the W thin film. This figure shows the results when the above described deposition was carried out after the initiation step was carried out for 20 seconds to 80 seconds at a heating temperature of 410° C. under a partial pressure of $SiH_4$ gas of 644 Pa. It can be seen from this figure that the value of Haze is substantially stable if the initiation time is not less than 40 seconds. Although there is no upper limit to the initiation time in view of the improvement of the surface condition after deposition, the initiation time is preferably not more than 80 seconds in view of the improvement of throughput.

Figure 7:
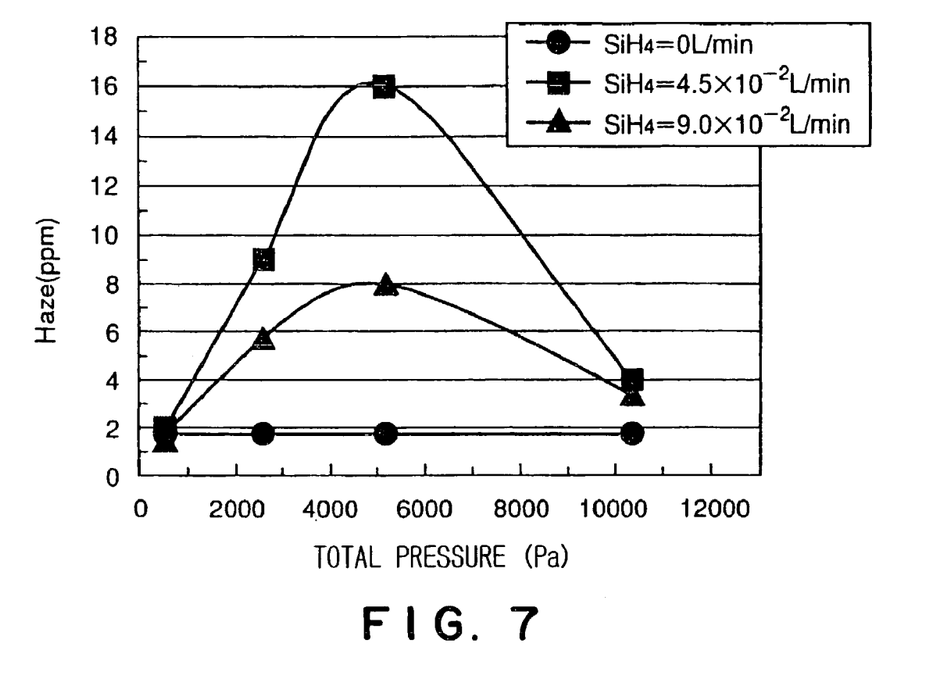
FIG. 7 is a graph showing the relationship between the total pressure in a processing vessel at an initiation step and the value of Haze of a W thin film formed at the subsequent deposition step.
Figure 8:
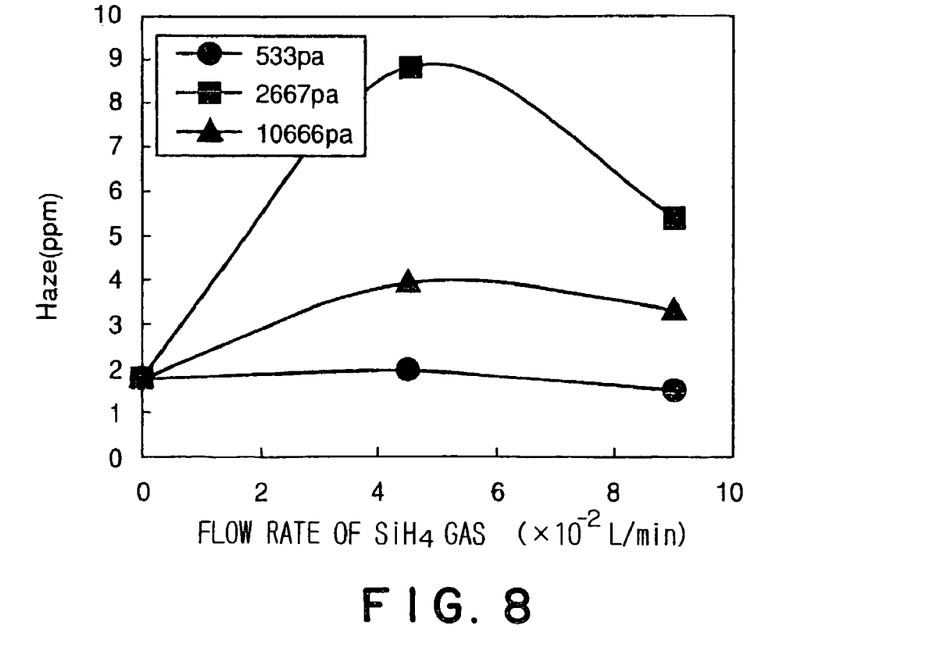
FIG. 8 is a graph showing the relationship between the flow rate of $SiH_4$ gas at an initiation step and the value of Haze of a W thin film formed at the subsequent deposition step.

FIGS. 7 and 8 shows the relationship between the total pressure in the processing vessel and the value of Haze of the W thin film, and the relationship between the flow rate of $SiH_4$ gas and the value of Haze of the W thin film, respectively, using data forming the basis for FIG. 5. It can be seen from these figures that the total pressure is preferably not less than 7000 Pa, and/or the flow rate of $SiH_4$ is preferably about not less than $6 \times 10^{-2}$ L/min.

At the initiation step, $H_2$ gas can be preferably used as a gas other than $SiH_4$ gas, but the gas should not be limited thereto. However, when $N_2$ gas is used, even if the partial pressure of $SiH_4$ is the same, the value of Haze is better as the flow rate of $N_2$ gas is smaller. This is shown in FIG. 9.

Figure 9:
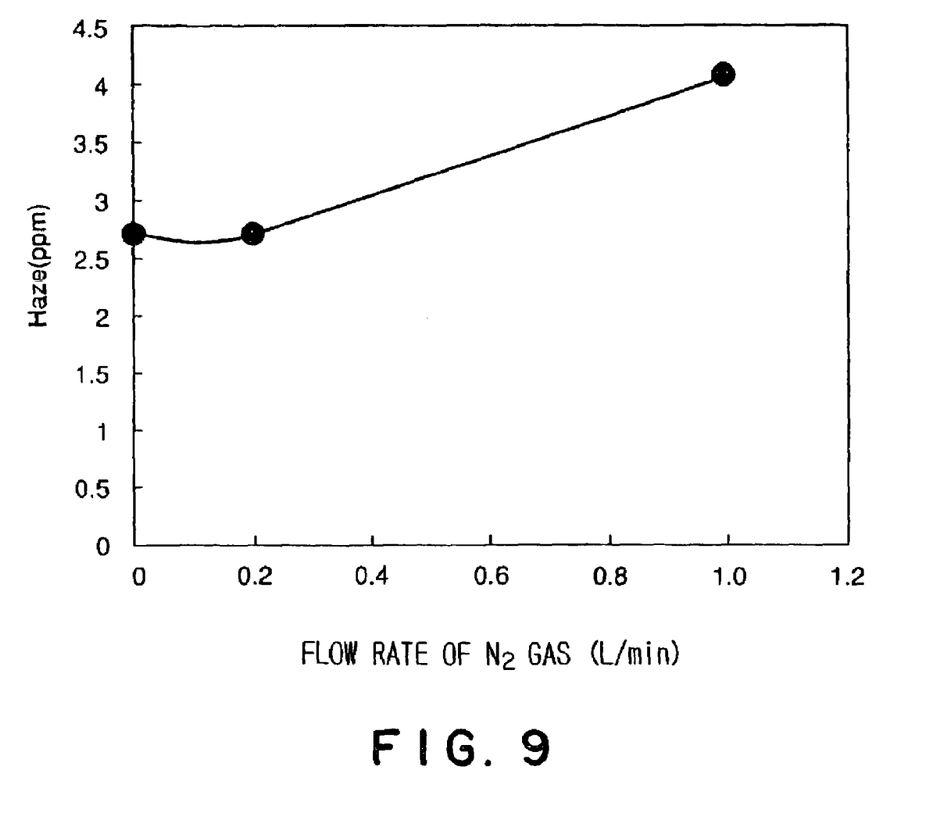
FIG. 9 is a graph showing the relationship between the flow rate of $N_2$ gas at an initiation step and the value of Haze of a W thin film formed at the subsequent deposition step.

FIG. 9 is a graph showing the relationship between the flow rate of N$_2$ gas and the value of Haze of the W thin film when the partial pressure of SiH$_4$ gas at the initiation step is a constant value of 644 Pa and when the initiation time is 20 seconds. It can be seen from this figure that the value of Haze is smaller as the flow rate of N$_2$ gas is smaller even if the partial pressure of SiH$_4$ gas is the same. This tendency is more remarkable as the processing time is shorter.

After the initiation step, the step (ST3) of depositing a W thin film is carried out. At this deposition step, the nucleation step (ST3-1) is first carried out. At this time, WF$_6$ gas is fed from the gas line 59 to the gas line 85 to carry out the nucleation of W. The WF$_6$ gas is fed at a lower flow rate of $1 \times 10^{-2}$ to $3 \times 10^{-2}$ L/min than that at the subsequent main deposition, e.g. at a flow rate of $1.5 \times 10^{-2}$ L/min, while strictly controlling the flow rate by means of the mass flow controller (MFC) 69. Then, WF$_6$ gas is fed from the gas line 59 at a higher flow rate of $6 \times 10^{-2}$ to $20 \times 10^{-2}$ L/min than that at the nucleation, e.g. at a flow rate of $7.0 \times 10^{-2}$ L/min, to carry out the main deposition step (ST3-2).

At the main deposition step (ST3-2), the halogen lamps 26 are turned on to heat the wafer 10 similar to the heat-up step (ST1) and initiation step (ST2). At this time, the heating temperature is preferably in the range of from 380° C. to 500° C. Ar gas, H$_2$ gas and N$_2$ gas are fed in addition to WF$_6$ gas. Examples of flow rates of these gases includes $7.0 \times 10^{-2}$ L/min with respect to WF$_6$ gas, 0.8 L/min with respect to Ar gas, 1.2 L/min with respect to H$_2$ gas, and 0.1 L/min with respect to N$_2$ gas.

The processing time is about 20 to 60 seconds at the nucleation step, and about 20 to 60 seconds at the main deposition step, respectively, so that a W thin film having a thickness of about 50 to 200 nm is formed. In the example shown in the graph of FIG. 5, the processing time is 30 seconds at the nucleation step, and the processing time is 27 seconds at the main deposition step, so that a W thin film having a thickness of 100 nm is formed.

After the elapse of a predetermined period of time, the value of the gas line 59 is closed to stop the supply of WF$_6$ gas from the WF$_6$ gas supply source 53 to complete the deposition step. Thereafter, the flow rate of Ar gas is increased to purge the interior of the processing vessel 11. Then, ClF$_3$ gas is supplied into the processing vessel 11 to clean the interior of the processing vessel, if necessary.

The above described series of steps are carried out, and the partial pressure of SiH$_4$ gas is increased particularly at the initiation step to increase the amount of colliding gas molecules, so that it is possible to stably obtain a W thin film having a good surface condition that the surface roughness of the film is small and the abnormal grain growth is small.

The present invention should not be limited to the above described preferred embodiment, and can be modified in various ways. For example, while the W thin film has been formed on the TiN thin film serving as an underlying film in the above described preferred embodiment, the underlying film and the film formed thereon should not be limited thereto. The present invention can be applied to a case where an Si-containing gas is used in a pretreating prior to deposition. For example, the present invention can be applied to a pretreating, such as nucleation, when a silicide, such as WSi or TiSi, is deposited. While SiH$_4$ gas has been used as the Si-containing gas for the pretreating, the Si-containing gas should not be limited thereto, but another Si-containing gas, such as Si$_2$H$_6$ or SiCl$_2$H$_2$, may be used. While the semiconductor wafer has been used as the substrate on which the deposition is to be carried out, the present invention should not be limited thereto, but the invention may be applied to another substrate, such as a glass substrate for a liquid crystal display (LCD).

The invention claimed is:

1. A deposition method for forming a film on a substrate, said method comprising:
    a step of arranging a substrate in a processing vessel;
    a pretreating step of supplying an Si-containing gas and an H$_2$ gas into said processing vessel to absorb Si-containing molecules onto said substrate; and
    a deposition step of supplying a deposition gas into said processing vessel to form a film on the pretreated substrate,
    said pretreating step being carried out at a partial pressure of said Si-containing gas of not less than 100 Pa, and wherein said pretreating step is carried out at a total pressure of 533 to 10666 Pa in said processing vessel.

2. A deposition method for forming a film on a substrate, said method comprising:
    a step of arranging a substrate in a processing vessel;
    a preheating step of preheating said substrate in said processing vessel;
    a pretreating step of supplying an Si-containing gas and an H$_2$ gas into said processing vessel to absorb Si-containing molecules onto said substrate; and
    a deposition step of supplying a deposition gas into said processing vessel to form a film on the pretreated substrate,
    said pretreating step being carried out at a partial pressure of said Si-containing gas of not less than 50 Pa, and wherein said pretreating step is carried out at a total pressure of 533 to 10666 Pa in said processing vessel.

3. A deposition method as set forth in claim 1 or 2, wherein said pretreating step is carried out at the total of 7000 to 10666 Pa in said processing vessel.

4. A deposition method for forming a film on a substrate, said method comprising:
    a step of arranging a substrate in a processing vessel;
    a pretreating step of supplying an SiH$_4$ gas and an H$_2$ gas into said processing vessel to absorb SiH$_x$ onto said substrate; and
    a deposition step of supplying a deposition gas into said processing vessel to form a W thin film on the pretreated substrate,
    said pretreating step being carried out at a partial pressure of said SiH$_4$ gas of not less than 100 Pa, wherein said pretreating step is carried out at a total pressure of 533 to 10666 Pa in said processing vessel.

5. A deposition method for forming a film on a substrate, said method comprising:
    a step of arranging a substrate in a processing vessel;
    a preheating step of preheating said substrate in said processing vessel;
    a pretreating step of supplying an SiH$_4$ gas and an H$_2$ gas into said processing vessel to absorb SiH$_x$ onto said substrate; and
    a deposition step of supplying a deposition gas into said processing vessel to form a W thin film on the pretreated substrate,
    said pretreating step being carried out at a partial pressure of said SiH$_4$ gas of not less than 50 Pa, wherein said pretreating step is carried out at a total pressure of 533 to 10666 Pa in said processing vessel.

6. A deposition method as set forth in claim 4 or 5, wherein said pretreating step is carried out by feeding said SiH$_4$ gas at a flow rate of not less than $6 \times 10^{-2}$ L/min.

7. A deposition method as set forth in claim 4 or 5, wherein said pretreating step is carried out at the total of 7000 to 10666 Pa in said processing vessel.

8. A deposition method as set forth in claim 4 or 5, wherein said pretreating step is carried out for not less than 40 seconds.

9. A deposition method as set forth in claim 4 or 5, wherein said deposition step includes a nucleation step for forming nuclei, and a main deposition step carried out subsequently to said nucleation step.

10. A deposition method as set forth in claim 4 or 5, wherein said substrate is provided with a TiN thin film serving as an underlying film previously formed on a surface thereof.

11. A deposition method for forming a film on a substrate, said method comprising:
    a step of arranging a substrate in a processing vessel;
    a preheating step of preheating said substrate in said processing vessel;
    a pretreating step of supplying an $SiH_4$ gas and an $H_2$ gas into said processing vessel to absorb $SiH_x$ molecules onto said substrate at a partial pressure of said $SiH_4$ of not less than 50 Pa; and
    a deposition step of forming a W thin film on the pretreated substrate, said deposition step comprising:
    a nucleation step of forming nuclei of W on said substrate by supplying a first deposition gas including a $WF_6$ gas into said processing vessel; and
    a subsequent main deposition step of depositing said W thin film on said substrate by supplying a second deposition gas including a $WF_6$ gas into said processing vessel, and wherein said pretreating step is carried out at a total pressure of 533 to 10666 Pa in said processing vessel.

12. A deposition method as set forth in claim 11, wherein said pretreating step is carried out at the total of 7000 to 10666 Pa in said processing vessel.

13. A deposition method as set forth in claim 11, wherein a flow rate of said $WF_6$ gas in said first deposition gas is lower than that of said $WF_6$ gas in said second deposition gas.

14. A deposition method as set forth in claim 11, wherein said substrate is provided with a TiN thin film serving as an underlying film previously formed on a surface thereof.

15. A deposition method as set forth in claim 11, wherein said preheating step is carried out while flowing $H_2$ gas and an inert gas into said processing vessel.

* * * * *